(12) United States Patent
Crispell et al.

(10) Patent No.: US 6,559,535 B2
(45) Date of Patent: May 6, 2003

(54) LEAD STRUCTURE FOR SEALING PACKAGE

(75) Inventors: Robert B. Crispell, Mohnton, PA (US); Mark J. Nelson, Reading, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/781,423

(22) Filed: Feb. 13, 2001

(65) Prior Publication Data

US 2002/0109210 A1 Aug. 15, 2002

(51) Int. Cl.[7] .............................................. H01L 23/10
(52) U.S. Cl. ...................... 257/710; 257/666; 257/668; 257/704
(58) Field of Search ............................... 257/666–677, 257/704, 710; 361/717–723

(56) References Cited

U.S. PATENT DOCUMENTS

| | | | | |
|---|---|---|---|---|
| 5,147,815 A | * | 9/1992 | Casto | 257/666 |
| 5,393,705 A | * | 2/1995 | Sonobe | 257/214 |
| 5,483,740 A | * | 1/1996 | Maslakow | 29/827 |
| 5,495,125 A | * | 2/1996 | Uemura | 257/662 |
| 5,608,359 A | * | 3/1997 | Knecht et al. | 257/666 |
| 5,869,898 A | * | 2/1999 | Sato | 257/728 |
| 5,949,649 A | * | 9/1999 | Bartlow | 361/704 |
| 6,049,470 A | * | 4/2000 | Weale | 361/820 |
| RE36,894 E | | 10/2000 | Greenberg et al. | |

OTHER PUBLICATIONS

Phillip A. Laplante, 1999, Comprehensive Dictionary of Electrical Engineering, CRC Press, First Edition, pp. 361.*

* cited by examiner

*Primary Examiner*—Nathan J. Flynn
*Assistant Examiner*—Leonardo Andújar

(57) ABSTRACT

A sealing package for an integrated circuit chip including a lead structure with first lead members and second lead members. The first lead members are located proximate the corners of the sealing package and have two lead portions external to the sealing package and one lead portion internal to the sealing package. The second lead members are fanned out along the sides of the sealing package and have one lead portion internal to the sealing package and one lead portion external to the sealing package. Each first lead member adapted to provide a connection to ground for at least two sides of the sealing package. Each second lead member adapted to provide a connection between an integrated circuit chip internal to the sealing package and external circuitry.

11 Claims, 5 Drawing Sheets

LEAD STRUCTURE FOR SEALING PACKAGE

BACKGROUND OF THE INVENTION

1. Field of the Invention

The present invention relates to sealing packages for integrated circuits, and more particularly, a lead frame for a sealing package.

2. Description of the Related Art

Due to the decreasing size constraints on micro-electronic circuits and the increasing demands on the circuits, there is a demand for smaller and more efficient circuit devices. According to the prior art, one way that integrated circuit chips or dyes are incorporated into electronic circuits is by containment inside a sealing package device. The sealing package device provides connections between the integrated circuit chip and voltage sources and voltage outputs, and provides connections to ground for the sealing package and dye.

An example of a sealing package 1 of the prior art is depicted in FIGS. 1a and 1b. The sealing package 1 has a top portion or lid 5 and a bottom portion or base 6. In between the top portion 5 and bottom portion 6, there is a lead structure of 32 leads 2 with 8 leads 2 extending from each of four sides 3. Also, a seal (not shown) exists between the top and bottom portion. Each lead 2 has an external lead portion, which extends outside the sealing package 1 and an internal lead portion (not shown) inside the sealing package 1. The leads 2 along each side 3 are equidistantly separated. In addition, both the internal and external lead portions are approximately perpendicular to a side of the sealing package 1.

An integrated circuit chip or dye (not shown) is contained in the interior of the sealing package 1. The dye is placed in a cavity 4. The cavity 4 is formed in between the top portion 5 and bottom portion 6. The lead portions internal to the sealing package 1 are connected to the dye and or sealing package 1 and provide connections to the circuitry on the exterior of the sealing package 1 via the external portion of the leads 2.

Conventional sealing packages have several disadvantages that limit electrical efficiency. For example, the use of plastic as a material for encapsulating the dye lowers the electrical performance of the package because the plastic actually touches the chip. Also, it is difficult to manufacture such a small device with the 32 separate and equidistant leads on the interior and exterior of the sealing package.

SUMMARY OF THE INVENTION

The invention overcomes the aforementioned problems by providing a novel lead structure, preferably in a sealing package made of glass and metal rather than plastic. Conventional glass and metal sealing packages only exist with a total of 24 leads, but the lead structure according to the present invention allows a 32 lead glass to metal sealing package having 32 external lead portions to be manufactured.

A preferred embodiment of the invention is a lead structure for sealing package for an integrated circuit chip. The lead structure includes a lead member for providing a lead internal to the sealing package and more than one lead external to the sealing package. There may be two leads external to the sealing package with a first external lead on a first side of the sealing package and a second external lead on a second side of the sealing package, and the second side of the sealing package intersecting the first side of the sealing package.

The lead member is situated proximate or at a corner of the sealing package. The lead member can be situated such that the internal lead substantially bisects a corner of the sealing package formed by the first and second sides, and the first and second external leads are substantially parallel to the first and second sides, respectively.

The first and second external leads define an angle there between. The angle may, for example, be 90 degrees. Also, the first lead member is adapted to provide connections to a ground for two intersecting sides of the sealing package by having the first and second external leads adapted to be connected to a ground and the internal lead adapted to be connected to the sealing package.

The invention also includes a lead structure for a sealing package for an integrated circuit chip including a plurality of lead members having a lead portion internal to the sealing package and a lead portion external to the sealing package. The plurality of lead members are adapted to provide connections between an integrated circuit chip inside the sealing package and a ground and a voltage reference. The voltage reference may include a voltage source and a voltage drain.

The lead structure of the plurality of lead members includes external lead portions, which are substantially parallel to each other. Also, the internal lead portions are arranged along a side of the sealing package such that a first angle is in between an internal lead portion and the side and a second angle is in between another internal portion and the side.

The invention also includes a sealing package device for an integrated circuit chip. The sealing package includes a plurality of first leads for providing a connection to a ground for each of two intersecting sides of the package device, and a plurality of second leads for providing connections between an integrated circuit chip internal to the package and a voltage source and a voltage drain between the package and the ground. Further, each of the plurality of first leads is adapted to provide two connections on the exterior of the package and one connection on the interior of the package. Also, each of the plurality of second leads is adapted to provide one connection interior to the package and one connection exterior to the package.

The invention is also embodied in a package device for an integrated circuit chip, which includes a base and a lid with an integrated circuit chip, a first type of lead members and a second type of lead members between the base and lid. The first plurality of leads having a first lead portion, a second lead portion, and a third lead portion with the first lead portion being connected to the base, and the second lead portion and the third lead portion being external to the base and the lid. The second plurality of leads between the lid and the base, the second plurality of leads being connected to the integrated circuit chip. Further, the base and the lid do not touch the chip.

The base includes a corner and at least one of the first plurality of leads is positioned proximate the corner. Also, at least one of the first plurality of leads may be positioned at the corner.

The first and second plurality of leads of the package device are adapted to provide connections along a side of the package device. The connections alternate between a ground and a reference voltage.

The second plurality of leads includes at least one lead with a first lead portion thereof adapted to be connected to a voltage source and the second lead portion thereof adapted to be connected to the integrated circuit chip; at least one lead with a first lead portion thereof adapted to be connected to a voltage drain and a second lead portion thereof adapted to be connected to an integrated circuit chip; and at least one lead with a first lead portion thereof adapted to be connected to a ground and a second lead portion thereof adapted to be connected to the base.

The base and lid are substantially the same shape, have a plurality of corners and the lid does not overlap a periphery of the base. The lid includes a top layer of metal and a bottom layer of glass and the base includes a bottom layer of metal and a top layer of glass. A hermetic seal is between the glass layer of the lid and glass layer of the base and holds the base and lid together.

Internal to the sealing substrate, the base and lid define a cavity into which the chip is placed. The cavity reaches from the bottom layer of metal of the base to the top layer of metal of the lid and the layers of glass on the sides. Also, the base and lid both have inner portions with a smaller thickness than the outer portions.

The invention also includes an integrated circuit including a base and a lid with an integrated circuit chip, a first plurality of leads and a second plurality of leads between the lid and the base. Another aspect of the invention is a lead frame including a frame with a plurality of sides at least one of the first type of lead members and one of the second type of lead members. Both of the first type and second type of lead members are connected to the lead frame. The first type of lead member has two lead portions connected to different sides of the frame and one unattached lead portion. The second type of lead member has one lead portion attached to the frame and one lead portion unattached to the frame. Further, all of the unattached portions form an outline of a polygon with the first lead portions proximate the corners of the polygon and second lead portions along the sides of the polygon. The first lead portions may also be located at the corners of the polygon.

BRIEF DESCRIPTION OF THE DRAWINGS

The preferred embodiment of the present invention will become more fully understood from the detailed description given herein below and the accompanying drawings which are given by way of illustration only, wherein like numerals designate corresponding parts in the various drawings, and wherein:

FIG. 2c depicts a cross section of the sealing package along line 2c in FIG. 2a;

DETAILED DESCRIPTION OF THE INVENTION

Figure 1A:
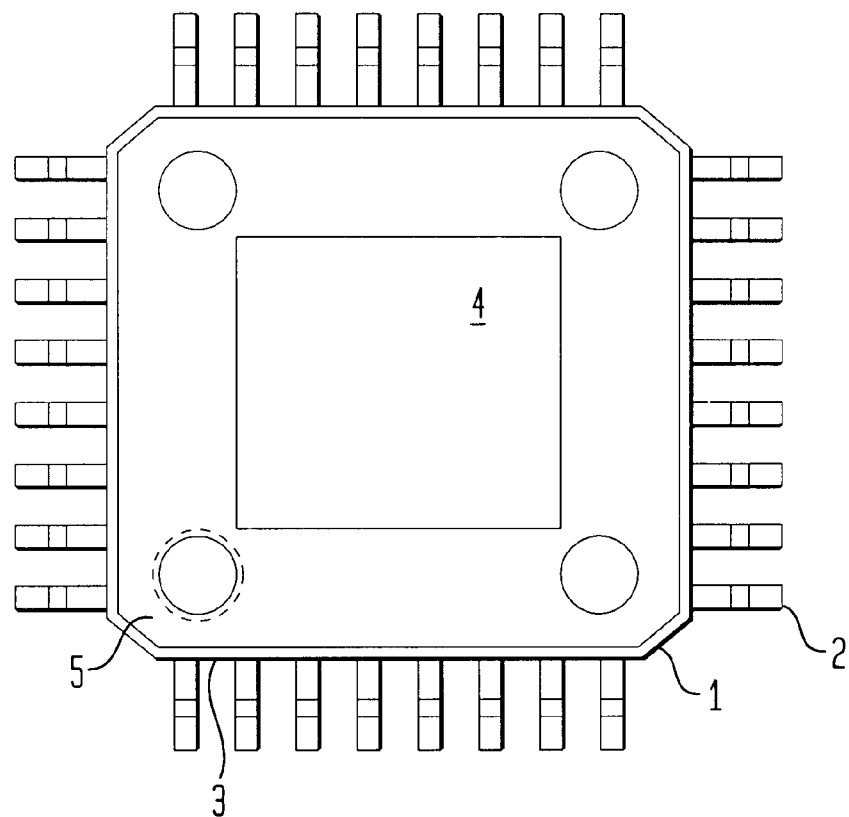
FIG. 1a depicts the top view of a prior art sealing package.
Figure 1B:
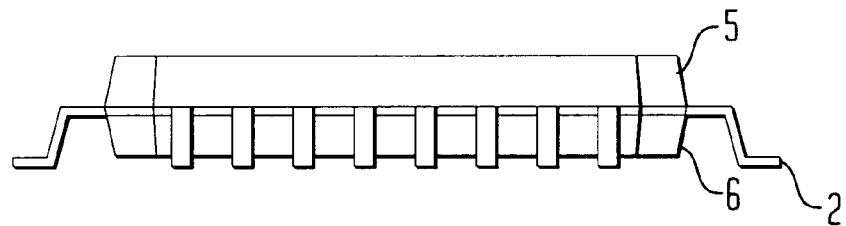
FIG. 1b depicts the side view of a prior art sealing package.
Figure 2A:
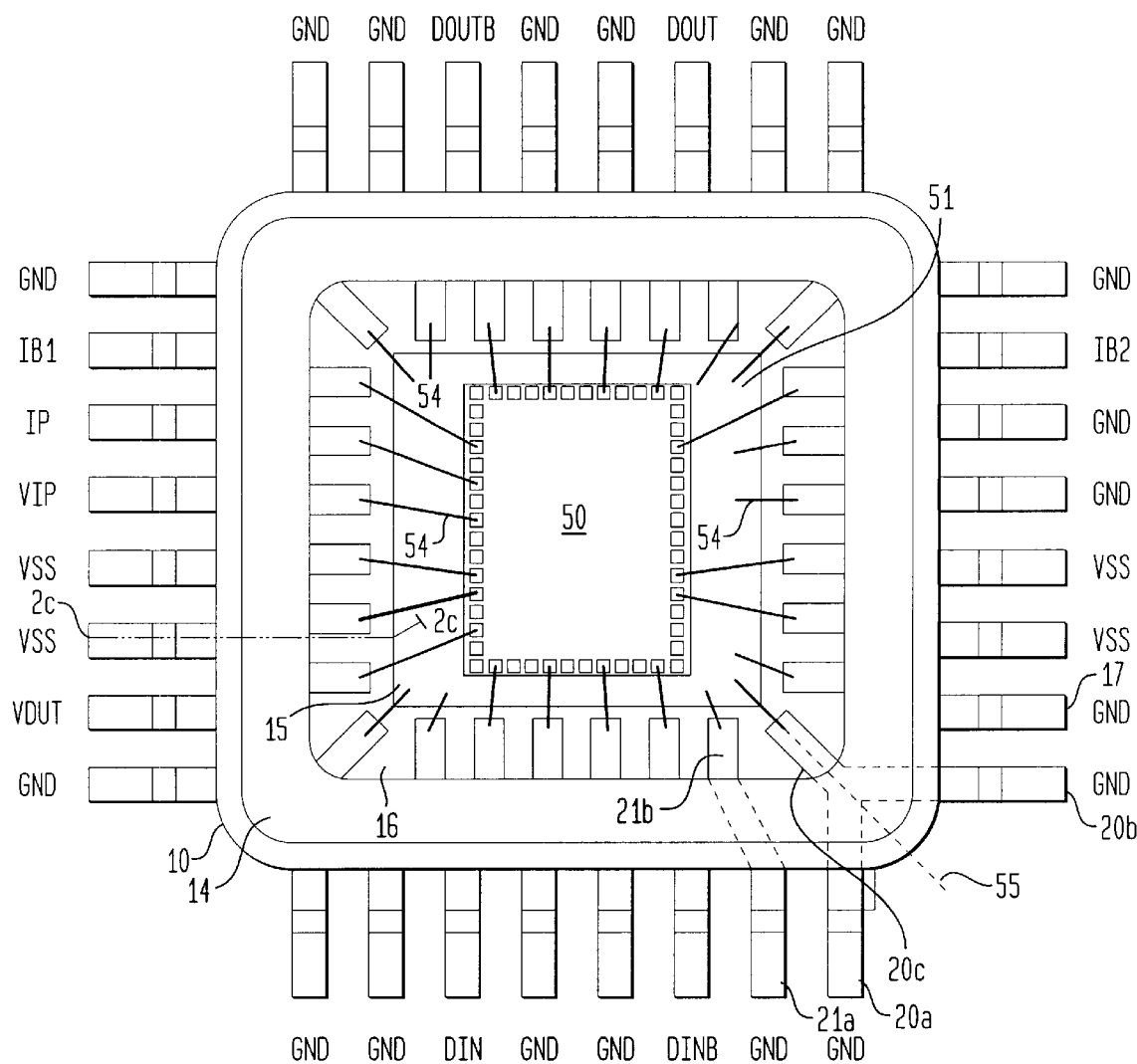
FIG. 2a depicts the top view of the sealing package showing the internal cavity, internal and external leads, internal and external lead connections and dye.
Figure 2B:
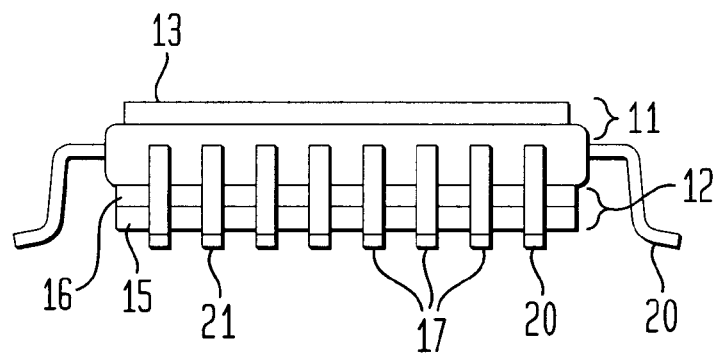
FIG. 2b depicts a side view of the sealing package and external lead portions of the invention.
Figure 2C:
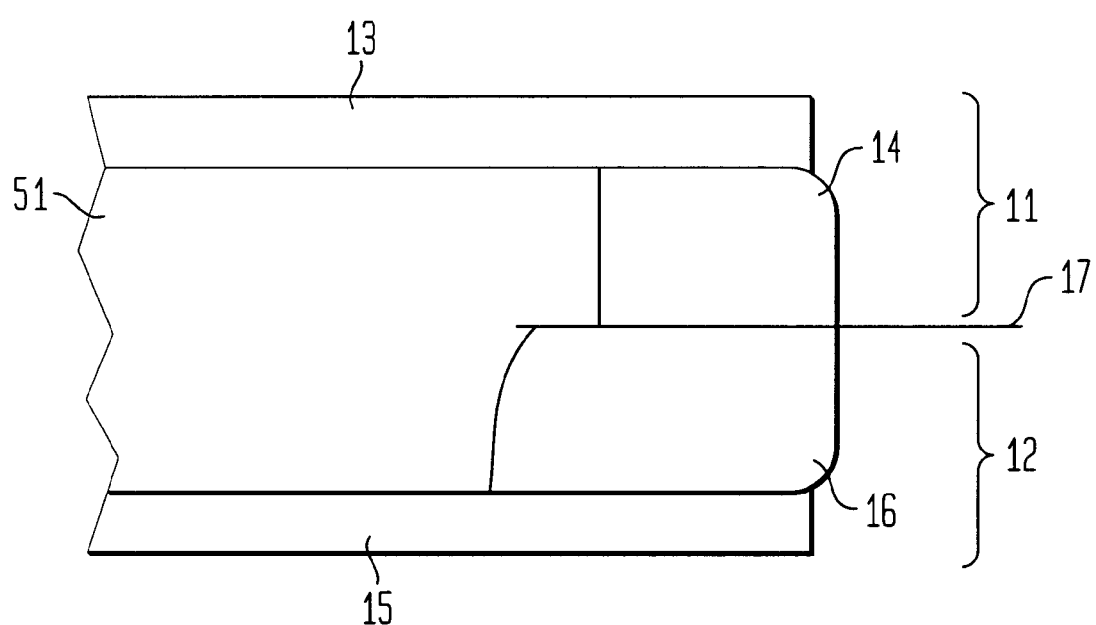

FIG. 2a illustrates a top view of the sealing package; FIG. 2b illustrates a side view of the sealing package; and FIG. 2c illustrates a cross section of the sealing package along line 2c in FIG. 2a. As shown, the sealing package 10 includes a top portion or lid 11 and a bottom portion or base 12. The top portion 11 is composed of a metal top layer 13 over a first glass layer 14.

The bottom portion 12 is composed of a metal bottom layer 15 and a top, second glass layer 16. A plurality of leads 17 and a dye 50 are positioned in between the top portion 11 and the bottom portion 12. The leads include a first type of lead 20 and a second type of lead 21. A hermetic seal (not shown) is formed in between the glass layer 14 and the glass layer 16 of the bottom portion 12 and holds the top portion 11 and the bottom portion 12 together.

The metal layer 13 may be formed from various metals but in the preferred embodiment, for example, an alloy of copper, nickel and cobalt is used. Also, while the preferred embodiment is illustrated and described as a square sealing package made of glass and metal, it is noted that sealing packages of any size, shape and materials may utilize the various features of the invention.

As shown in FIG. 2a, the sealing package 10 contains a dye 50. The dye is placed in a cavity 51, which is formed in between the top portion 11 and bottom portion 12 of the sealing package 10. The cavity extends from the metal layer 15 internal to the sealing package 10 to the metal layer 11 and is bounded on the sides by the glass layers 14 and 16.

The sealing package 10 is incorporated into electronic circuits by making connections between the dye 50 and the external circuitry (not shown) and connections between the dye and sealing package to ground (not shown). The connections are formed by wire bonding 54 the leads 17 to either the dye 50 or the metal layer 15, as desired. As shown in FIG. 2a, the internal portion of the second leads 21 may be wire bonded 54 at various positions on the dye, and provide connections between the dye and various points in the external, circuitry such as a ground, voltage source or voltage output.

Figure 5:
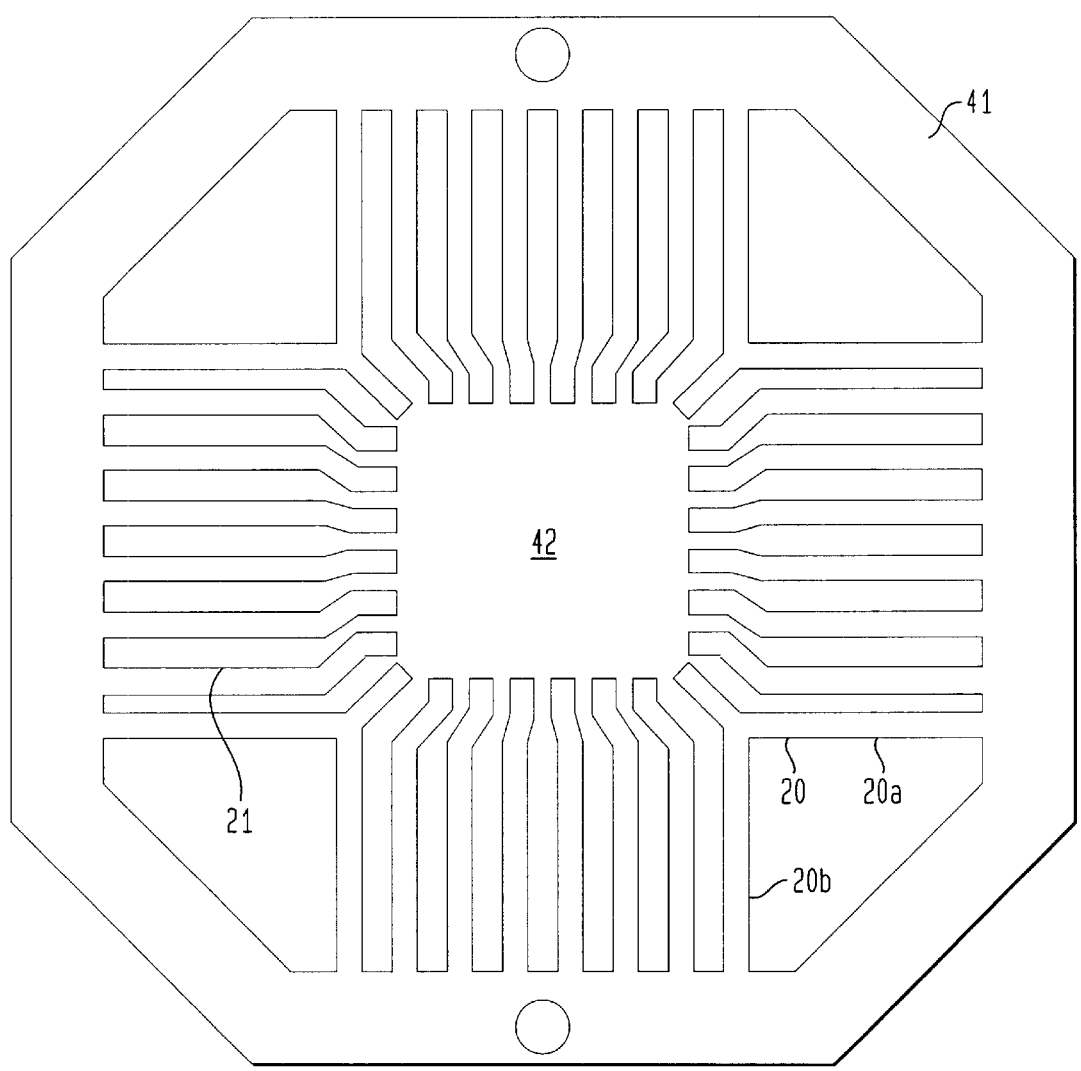
FIG. 5 depicts a lead frame used in assembling the sealing package.

The first type of leads 20 are primarily used to ground the sealing package 10, and a single first type of lead 20 is able to provide connections to ground for each of two intersecting sides of the sealing package 10. The internal portion 20c is wire bonded to the metal layer 15 and the external portions 20a and 20b are each connected to ground. Although FIG. 5 depicts the first type of leads 20 providing a connection to ground, the first type of leads 20 may provide connections between the dye 50 and other portions of the circuitry. The intersecting sides may be orthogonal or intersect at various angles according to the shape of the sealing package 10.

As shown in FIG. 2a, when assembled, the sealing package 10 has 32 external lead portions and 28 internal lead portions. However, the invention is not limited to the 32 external and 28 internal lead portions combination. It is contemplated that the first type of leads 20 may be used in sealing packages 10 of various shapes that may have more or less than 4 corners at which the first type of leads 20 may be placed. As a result, the number of external leads portions may be more or less than 32 and number of internal lead portions may be more or less than 28.

Figure 3:
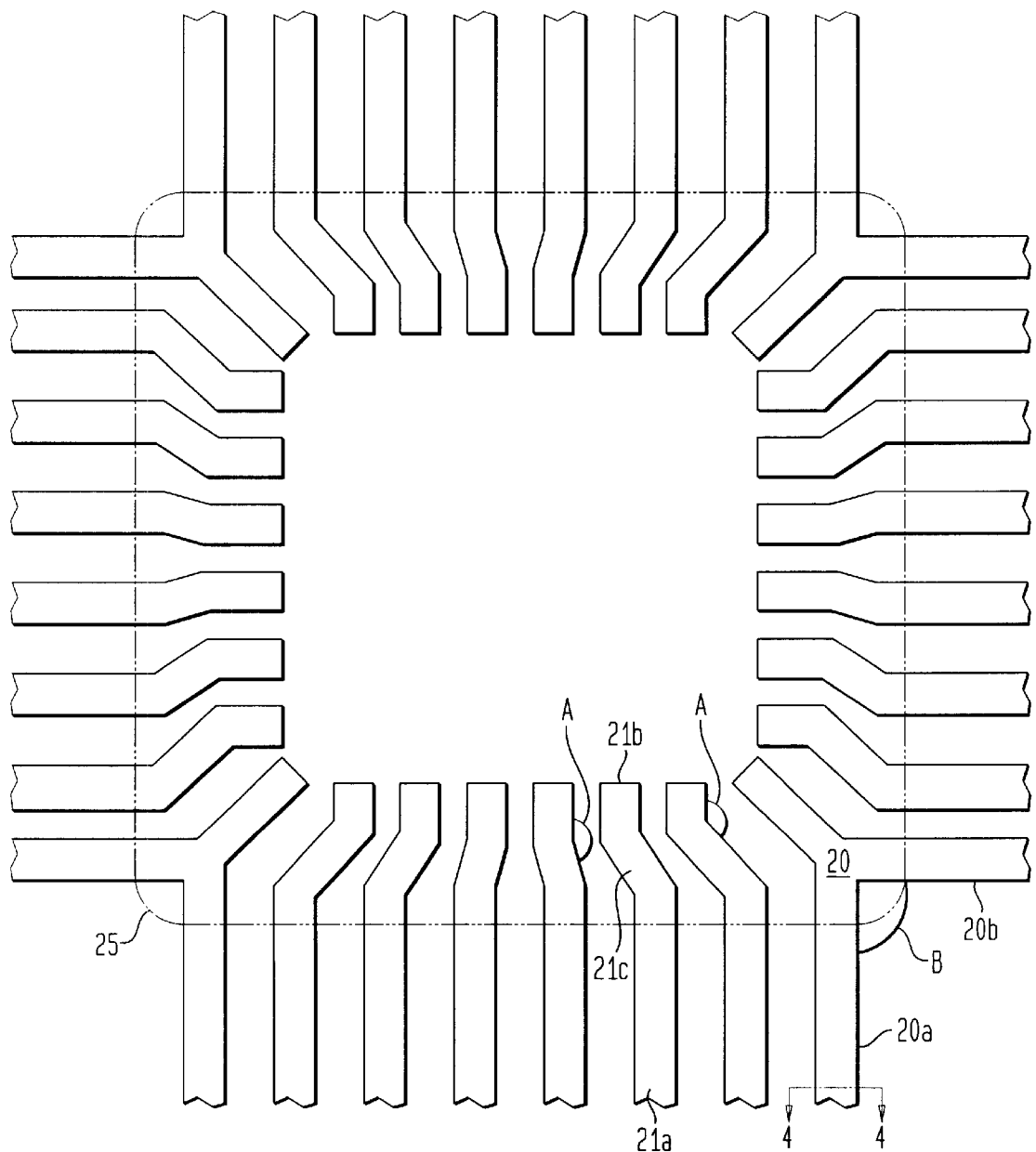
FIG. 3 depicts an enlarged view of the lead structure.

The leads 17 are made of an electrically conductive material. FIG. 3 more clearly illustrates the structure of the leads 17 with the outline 25 of the sealing package in phantom. As shown in FIG. 3, there are two types of leads 17. The first type of leads 20 has two external lead portions 20a and 20b and one internal lead portion 20c. As shown in FIG. 2a, the first type of leads 20 are located at the corners of the sealing package 10 with external lead portions extending beyond the sealing package 10. In the preferred embodiment, the first type of leads 20 are situated such that a line 55 drawn through the center of internal lead portion 20c would substantially bisect the corner of the sealing package 10. However, other placements of the first type of leads 20 are contemplated.

As indicated in FIG. 3, the first type of leads 20 are formed such that the internal portion 20c is connected to the two external portions 20a and 20b, and an approximately 90 degree angle B is formed between external portions 20a and 20b. The first type of leads 20 are positioned such that one of the two external portions is substantially parallel to a first side of the package and the other external portion is substantially parallel to a side intersecting and the first side, as shown in FIG. 3. It is envisioned that the angle B could be made larger or smaller to accommodate sealing packages of various shapes.

The second type of leads 21 includes an external lead portion 21a and an internal lead portion 21b. The second type of leads 21 are arranged along the sides of the sealing package 10. However, the second type of leads 21 differ greatly from the prior art in structure and arrangement. As shown in FIG. 3, the second type of leads 21 have substantially equidistant and parallel external portions 21a. However, the internal portions 21b, while being substantially equidistant, are more closely spaced. Traversing from the internal portion 21b to the external portion 21a, the second type of leads 21 exhibit a fanning out from the center of the sides towards the corners. The fanning out is characterized by the angle A at the transition portion 21c between the internal and external portions 21b and 21a. As shown in FIG. 3, the angle A is smaller at the corners and larger towards the center. The fanning out provides less spacing in between the internal portions 21b than in between the external portions 21a.

Figure 4:
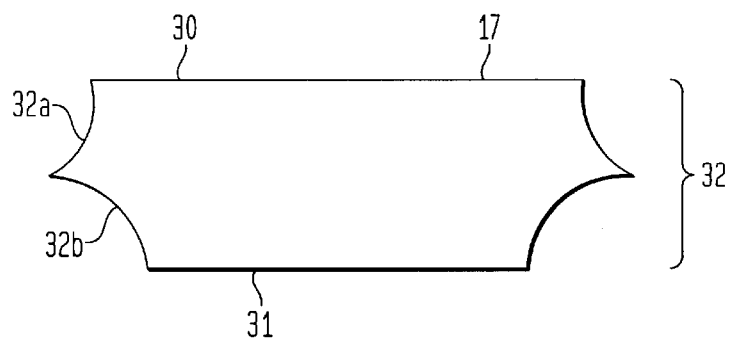
FIG. 4 depicts a cross section of leads along line 4 in FIG. 3.

FIG. 4 depicts a cross section of a lead 17 along line 4—4 in FIG. 3. As shown one surface 31 is not as wide as the first surface 30. Also, each side 32 of a lead 17 has two arched surfaces 32a and 32b.

Prior to assembling the sealing package device 10, the leads are manufactured in a lead frame as shown in FIG. 5. The lead frame has a frame 41 which is octagonal in shape and has each of the external lead portions 21a, 20a and 20b connected to an inner portion of the frame 41. Each of the second type of leads 21 have one connection to a side of the frame 41, but each of the first type of leads 20 are connected to two sides of the frame 41. Also, the internal portions of the first and second type of leads 20 and 21 form the outline of a square 42 interior to the frame 41. The second type of leads 21 form the sides of the square 42, and the first type of leads 20 form the corners of the square 42. In the preferred embodiment, the frame 41 has an octagonal shape, but it is envisioned that the lead frame may have other shapes. Also, the leads 17 may form the outline of various shapes corresponding to the shapes and needs of the sealing package 10 being used.

The sealing package 10 of this invention offers many benefits over the prior art. Also, the fanning structure of the second lead portions makes it easier to manufacture the second type of leads 21 with the desired spacing between the external lead portions and form the internal lead portions so that each will fit inside the sealing package 10.

Also, the electric performance of the sealing package 10 is improved. The ability to have 32 external lead portions in a sealing package 10 made of glass and metal and a hermetic seal permits a layer to surround the dye and act as the dielectric. This enhances electrical performance over plastic sealing packages 10, which allow portions of the plastic to touch the dye.

The structure of the first type of lead 20 permits additional connections to ground for the sealing package 10. Each first type of lead 20 provides a connection to ground for two sides. The additional ground connections provide more stability to the sealing package 10 and enhance electrical performance.

Furthermore, the use of the first type of lead 20 allows the sealing package 10 to fit onto a footprint requiring a high number of external leads (e.g., 32) and have a lower number of internal leads (e.g., 28). Thus, the lead structure according to the present invention alleviates problems of the reduced space internal to the sealing package 10.

The invention being thus described, it will be obvious that the same may be varied in many ways. Such variations are not to be regarded as a departure from the spirit and scope if the invention, and all such modifications are intended to be included within the scope of the following claims.

What is claimed is:

1. A package device for an integrated circuit chip comprising:

a lid, wherein the lid has a layer of glass and a layer of metal;

a base, wherein the base has a layer of glass and the metal layer;

an integrated circuit chip in between the base and the lid;

a first plurality of leads in between the lid and the base, each of the first plurality of leads having a first lead portion, a second lead portion and a third lead portion, the first lead portion being connected to the metal layer of the base, the second lead portion and the third lead portion being external to the base and lid;

a second plurality of leads between the lid and the base, the second plurality of leads being connected to the integrated circuit chip;

a hermetic seal in between the lid and base;

the hermetic seal holds the layer of glass of the base adjacent the layer of glass of the lid and the plurality of first leads; and the plurality of second leads being positioned between the layer of glass of the lid and the layer of glass of the base.

2. The package device of claim 1, wherein the integrated circuit chip is between the base and the lid such that the lid does not touch the base.

3. The package device of claim 1, wherein the second lead portion and the third lead portion are attached to each other at an angle.

4. The package device of claim 3, wherein the angle is substantially to a 90° angle.

5. The package device of claim 1, wherein each of the second plurality of leads has a first lead portion and a second lead portion.

6. The package device of claim 5, wherein the second plurality of leads includes:

at least one lead with the first lead portion thereof adapted to be connected to a voltage source and the second lead portion thereof adapted to be connected to the integrated circuit chip;

at least one lead with a first lead portion thereof adapted to be connected to a voltage drain and a second lead portion thereof adapted to be connected to the integrated circuit chip; and at least one lead with a first lead portion thereof adapted to be connected to a ground and a second lead portion thereof adapted to be connected to the base.

7. The package device of claim 1, wherein the base includes a corner, and at least one lead of the first plurality of leads is positioned proximate the corner.

8. The package device of claim 1, wherein at least one lead of the first plurality of leads is positioned at the corner.

9. The package device of claim 1, wherein the lid and base are of substantially the same shape, have a plurality of corners and the lid does not overlap a periphery of the base;

at least one lead of the first plurality of leads being located proximate each of the plurality of corners; and at least one lead of the second plurality of leads is located adjacent each corner of the plurality of corners.

10. The package device of claim 1, further comprising:

a hermetic seal in between the lid and the base, wherein the base has an inner portion and outer portion, the inner portion having a smaller thickness than the outer portion;

the lid has an inner portion and outer portion, the inner portion having a smaller thickness than the outer portion; and the lid and the base define a cavity that extends from said inner portion of the lid to the inner portion of the base, the cavity holding an integrated circuit chip.

11. The package device of claim 1, wherein the second plurality of leads and the first plurality of leads are adapted to provide connections along a side of the package device, said connections alternating between the package device and a ground and a reference voltage.

* * * * *